United States Patent [19]

Saeva

[11] Patent Number: 5,055,376
[45] Date of Patent: Oct. 8, 1991

[54] CURABLE COMPOSITIONS CONTAINING ONIUM SALT PHOTOINITIATORS WHICH HAVE A CHROMOPHORE LINKED TO THE ONIUM SALT MOIETY THROUGH THE 3-POSITION AND METHOD OF USE

[75] Inventor: Franklin D. Saeva, Webster, N.Y.

[73] Assignee: Eastman Kodak Company, Rochester, N.Y.

[21] Appl. No.: 611,632

[22] Filed: Nov. 13, 1990

[51] Int. Cl.$^5$ .................. G03C 1/492; C08F 2/46; C08T 3/28
[52] U.S. Cl. .................. 430/270; 430/914; 522/25; 522/31
[58] Field of Search .................. 522/31, 25; 430/270, 430/914

[56] References Cited

U.S. PATENT DOCUMENTS 4,933,377  6/1990  Saeva et al. .................. 522/170

OTHER PUBLICATIONS

Chemical Abstracts 113(16):142293y, Saeva et al., corresponds to EP 370693; 5-30-90; Onium Salts As Photoinitiator . . . .

Primary Examiner—Marion E. McCamish
Assistant Examiner—Mark A Chapman
Attorney, Agent, or Firm—Ogden H. Webster

[57] ABSTRACT

Compositions of matter are provided which comprise a material curable by a Bronsted acid, and a photoinitiator salt having the formula:

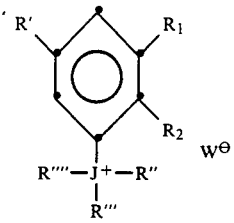

wherein:
$R^1$ represents an electron-donating chromophore group which absorbs visible radiation and which exhibits a higher energy occupied molecular orbital than at least one of R″, R‴ and R″″;
R″ represents the same substituent as R′ or R‴, an optionally substituted aryl group or an optionally substituted alkyl group having from 1 to 18 carbon atoms;
R‴ represents an electron-withdrawing alkyl, aryl or heterocyclic group;
$R_1$ and $R_2$ each, independently, represents hydrogen or an electron-donating group;
J represents an S, Se, As, N or P atom; and
when J represents As, N or P, R″″ represents the same substituent as R′, R″ or R‴, and when J represents an S or Se atom, R″″ represents O or an electron pair; and
$W^\ominus$ represents an anion capable of forming a Bronsted acid having a pKa of less than 7,
said photoinitiator salt being capable, upon exposure to visible radiation of a wavelength absorbed by said chromophore, of forming a Bronsted acid.

The invention also relates to the use of said compositions.

11 Claims, No Drawings

CURABLE COMPOSITIONS CONTAINING ONIUM SALT PHOTOINITIATORS WHICH HAVE A CHROMOPHORE LINKED TO THE ONIUM SALT MOIETY THROUGH THE 3-POSITION AND METHOD OF USE

This invention relates to curable compositions of matter containing as photoinitiators certain onium salts and to the use of such compositions.

It is well-known that various onium salts, upon exposure to radiation, are capable of forming a Bronsted acid, and that the Bronsted acid thus formed can cure a wide variety of materials. See, for example, *UV Curing: Science and Technology*, edited by S. Peter Pappas and published (1978) by Technology Marketing Corporation, 64 Westover Road, Stamford, Conn. 06902. The problem with such salts is that they do not absorb visible radiation and commonly must be used in combination with a light-absorbing photosensitizer in order to carry out visible light, e.g., laser, induced photoinitiation.

*Research Disclosure*, Vol. 289, May, 1988, page 298, (published by Kenneth Mason Publications Limited; Dudley Annex, 21a North Street, Emsworth; Hampshire PO10 7DQ; England) describes sulfonium salts and oxysulfonium salts which, upon exposure to visible radiation, undergo irreversible intramolecular rearrangement to form a Bronsted acid. The light-absorbing capability of these sulfonium and oxysulfonium salts depends upon resonance (i.e., $\pi$ resonance) throughout the molecule. The photo products of these salts absorb at shorter wavelengths than the starting sulfonium and oxysulfonium salts.

Saeva and Breslin, U.S. patent application Ser. No. 273,788 filed Nov. 21, 1988, and continuation-in-part U.S. patent application Ser. No. 419,245 filed Oct. 10, 1989, describe certain onium salts which absorb visible radiation by means of a chromophore joined, through an insulating linkage, to the remainder of the molecule. Such salts are capable of forming a Bronsted acid upon exposure of the light-absorbing chromophore to visible light. The advantage of such salts is that a chromophore can be selected which matches the desired exposing radiation, such as a visible laser, e.g., argon ion (488/515 nm), nitrogen ion (423 nm), copper vapor (510/578 nm), e-beam pumped CdS (494 nm) and the He-Ne laser 632 nm. While curable compositions containing such salts are highly effective, a need exists to improve the efficiency of such compositions.

In accordance with this invention, the desired efficiency is achieved when curable compositions of matter contain, as photoinitiator, a compound having the following formula:

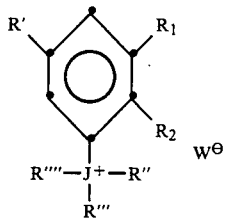

wherein:
R' represents an electron-donating chromophore which absorbs visible radiation and which exhibits a higher energy occupied molecular orbital than at least one of R", R'" and R"", such as a coumarin group, preferably an hydroxy-, methoxy- or carboxy-substituted coumarin group; a bifluorenylidene group, an anthracene group, a naphthacene group or a carbocyanine group, which groups can be further substituted with a group such as methoxy, methyl, chloro, phenoxy and thiomethyl to extend absorption of the chromophore to longer wavelength radiation or to fine-tune the electronic absorption behavior of R';

R" represents the same substituent as R' or R'", or an optionally substituted aryl group such as a phenyl group or a naphthyl group, or an optionally substituted alkyl group, advantageously having from 1 to 18 carbon atoms;

R'" represents an electron-withdrawing alkyl, aryl or heterocyclic group such as optionally substituted alkyl groups having from 1 to 18, and most preferably 1 to 4 carbon atoms; optionally substituent aryl groups having from 6 to 10 carbon atoms, and most preferably a phenyl group; and optionally substituent heterocyclic groups having from 1 to 4 rings and containing from 1 to 3 hetero atoms, such as N, S, O, Se or Te; preferably the R'" group contains an electron-withdrawing group, such as halogen, preferably F, Cl or Br; CN, $NO_2$, $-SO_2-$, $CF_3$ and the like;

$R_1$ and $R_2$ each, independently, represents hydrogen or an electron-donating group such as lower alkyl, e.g., methyl, ethyl, propyl or butyl, or alkoxy such as methoxy, ethoxy, propoxy or butoxy;

J represents an S, Se, As, N or P atom;

when J represents As, N or P, R"" represents the same substituent as R', R" or R'"; and, when J represents an S or Se atom, R"" represents either O or an electron pair; and $W^\ominus$ represents an anion capable of forming a Bronsted acid preferably having a pKa of less than 7, such as $BF_4^-$, $ClO_4^-$, $AsF_6^-$, $PF_6^-$, $CH_3SO_3^-$, $CF_3SO_3^-$, $FeCl_4^-$, $BiCl_4^{-2}$, $SnCl_6^{-3}$, $AlF_6^{-3}$, $GaCl_4^-$, $TiF_6^-$, $ZrF_6^-$, $SbF_6^-$ or p-toluenesulfonate, said salt being capable, upon exposure to visible radiation of a wavelength absorbed by said chromophore, of forming a Bronsted acid. It will be noted that the salts of the invention can contain two electron-donating chromophore groups, or two electron-withdrawing groups.

In the subject onium salts, the chromophore is linked to the S, Se, As, N or P atom by a 3-phenyl linkage. Such salts display efficiency much greater than the corresponding 2-phenyl or 4-phenyl linked isomers. The increase in efficiency commonly ranges from 10 to 15 percent, or higher, for the subject 3-linked onium salts. Although we do not wish to be bound by any theory, it may be that the subject 3-linked salts can form acid both through an electron-transfer mechanism as well as an intramolecular rearrangement.

The photoinitiators of this invention are advantageously employed with a proton source such as water, an amine or an alcohol.

Some highly useful compounds of this invention include compounds in which, referring to the above formula:

$R^1$ represents one of the following chromophores:

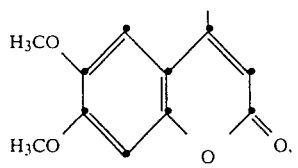

absorbs radiation longer than about 400 nm

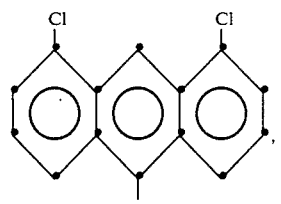

absorbs radiation longer than 400 nm

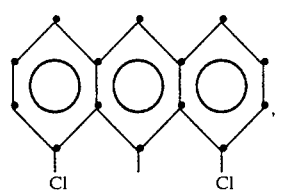

absorbs radiation longer than 400 nm

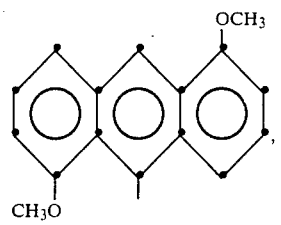

absorbs radiation longer than 400 nm

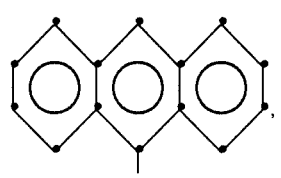

absorbs radiation longer than 400 nm

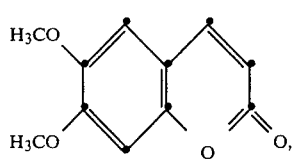

absorbs radiation longer than about 400 nm

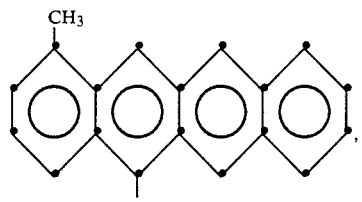

absorbs out to about 520 nm

-continued

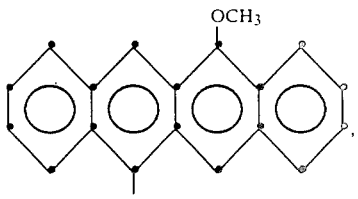

absorbs out to about 540 nm

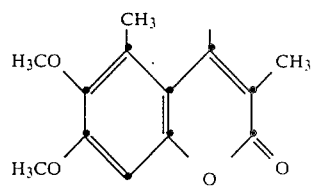

absorbs out to about 450 nm

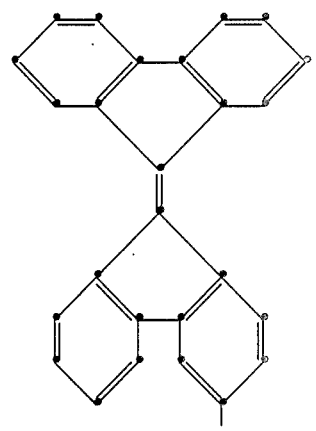

absorbs out to about 500 nm

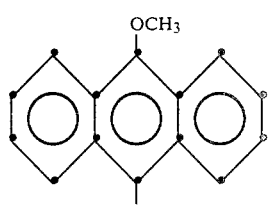

absorbs radiation longer than 400 nm

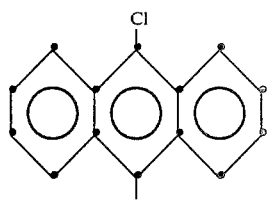

absorbs radiation longer than 400 nm

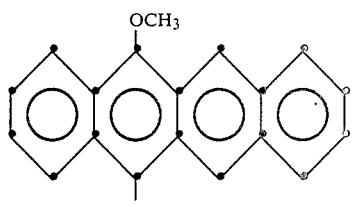

absorbs out to about 540 nm

-continued

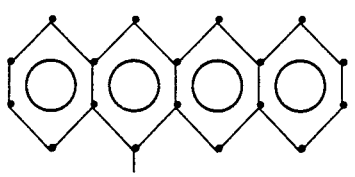

absorbs out to about 520 nm

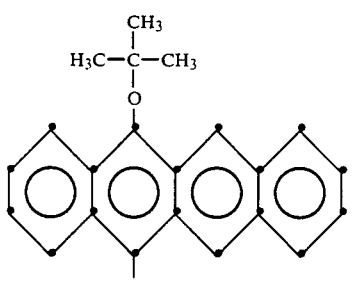

absorbs out to about 540 nm

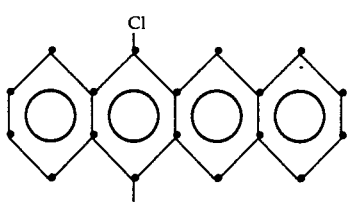

absorbs out to about 520 nm

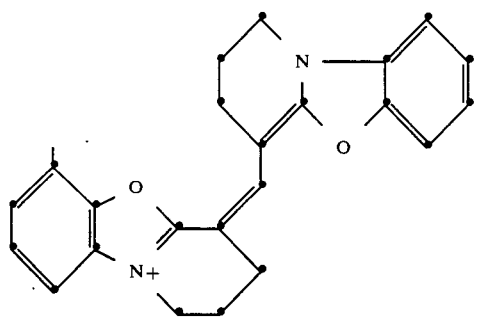

absorbs out to about 500 nm

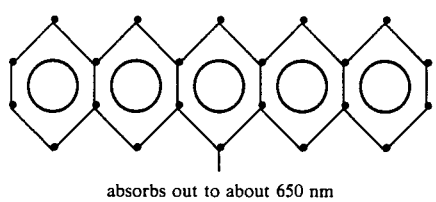

absorbs out to about 650 nm and J, R", R''' and R'''', taken together, represent one of the following groups:

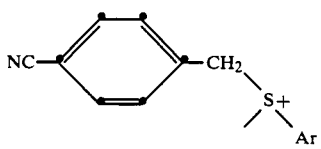

-continued

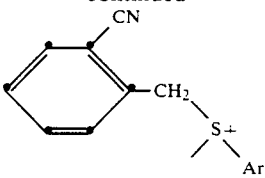

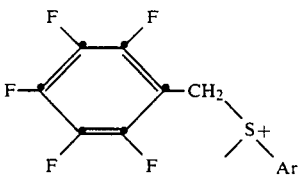

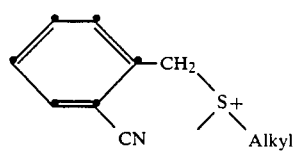

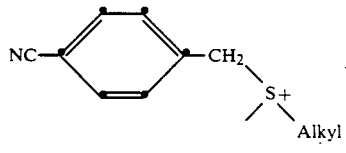

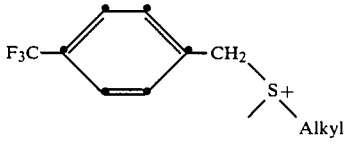

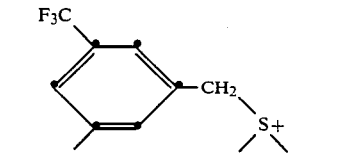

wherein

Ar represents an optionally substituted aryl group, such as phenyl or naphthyl, and alkyl represents an alkyl group such as methyl, ethyl, n-propyl or i-butyl; and W represents $BF_4$, $ClO_4$, $AsF_6$, $PF_6$, $CF_3SO_3$, $CH_3SO_3$, $SnCl_4$, $FeCl_4$, $BiCl_4$ and $SbF_6$.

The onium salts of this invention can be used in any application where it is desirable to release a Bronsted acid. The subject salts are especially useful in compositions curable by a Bronsted acid. Such compositions, also called cationically curable compounds, include cyclic formals and acetals, vinyl ethers, cyclic ethers, lactones, polysiloxanes, ureaformaldehyde resins, melamine-formaldehyde resins, and epoxides. A more comprehensive list is detailed in *Cationic Polymerization of Olefins: A Critical Inventory*, J. P. Kennedy, Wiley Interscience Pub., 1975. Epoxy resins are particularly preferred.

The useful epoxy resins preferably contain a plurality of epoxy groups and may be based on the reaction product of Bisphenol A (i.e. 2,2-bis(4-hydroxyphenyl)propane) and epichlorohydrin, e.g., the resins sold under the registered trademark Araldite by Ciba-Geigy Ltd., or are the reaction product of epichlorohydrin with a phenol-formaldehyde resin of relatively low molecular weight, e.g., epoxy-Novolaks (available, for example, from Dow), or other modified epoxy resins as disclosed in *UV Curing: Science and Technology* (cited above). Still other useful epoxy resins and ether-containing materials polymerizable to a higher molecular weight are listed in Berggren et al U.S. Pat. No. 4,291,114 (1981), column 4, line 37, through column 6, line 23, and the silicone-curable compositions disclosed by Eckberg U.S. Pat. No. 4,547,431 (1985), column 3, line 29, through column 4, line 17.

The onium salts of the invention can comprise from 0.1 to 30, and preferably from 1 to 25, percent by weight of the curable composition.

The onium salts of the invention can be used to provide protective coatings by imagewise or nonimagewise polymerization of monomers, e.g., the epoxide or ether-containing monomers referred to above. The present onium salts can be used advantageously to provide overcoats for optical recording elements, such as those described by Thomas et al U.S. Pat. No. 4,380,769 issued Apr. 19, 1983. Such recording elements have on a support, in order, a smoothing layer, a reflection layer, a heat-deformable optical recording layer and a protective overcoat layer.

The onium salts of this invention are useful in making printing plates. For example, the onium salts of this invention and a material which can be chemically modified by a Bronsted acid can be solvent-coated as a film onto an aluminum substrate. After the film has dried, it can be exposed to light absorbed by the chromophore of the onium salt, thus releasing a Bronsted acid. The film can be developed to produce a relief image by heating to vaporize chemical fragments from the exposed areas. The relief image can be inked and the resulting plate can be used as a printing plate. The relief image should be capable of being inked and capable of transferring the ink to a substrate, such as paper.

The onium salts of the invention can also be used in photoelectrographic elements which have a conductive layer in contact with an acid-generating layer containing an onium salt of the invention (the acid-generating layer being free from photopolymerizable monomer), as described in Molaire et al U.S. Pat. application Ser. No: 856,543 filed Apr. 28, 1986. Such elements can be imagewise-exposed, the acid-photogenerating layer can be electrostatically charged, and the resultant electrostatic image can be developed with charged toning particles. Also, the onium salts of the invention can be used in the electrophotographic elements and process described in Scozzofava et al U.S. Pat. No. 4,485,161 issued Nov. 27, 1984.

The onium salts of the invention can also be used in the method of making color filter arrays described by Molaire et al U.S. patent application Ser. No. 871,748 filed June 9, 1986. In that method, an electrophotographic element having a conductive layer in electrical contact with an acid-photogenerating layer comprising an electrically insulating binder and being free from photopolymerizable materials, is imagewise-exposed and electrostatically charged to form a latent image, and the latent image is developed with colored toner particles to form a single color array. Those steps can be repeated with different colored toners to produce a multicolored filter array.

The onium salts of this invention are particularly useful as photoinitiators to produce imagewise release of chemical fragments in a polymer system for photoresist, printing-plate or printed circuit board applications. For printed circuit board applications, compositions in accordance with this invention are coated on a conductive support, such as a copper or gold support. Upon exposure, the composition is removed in either the exposed or unexposed areas.

The following examples are included for a further understanding of the invention.

The compounds of this invention can be prepared conveniently by the following reaction:

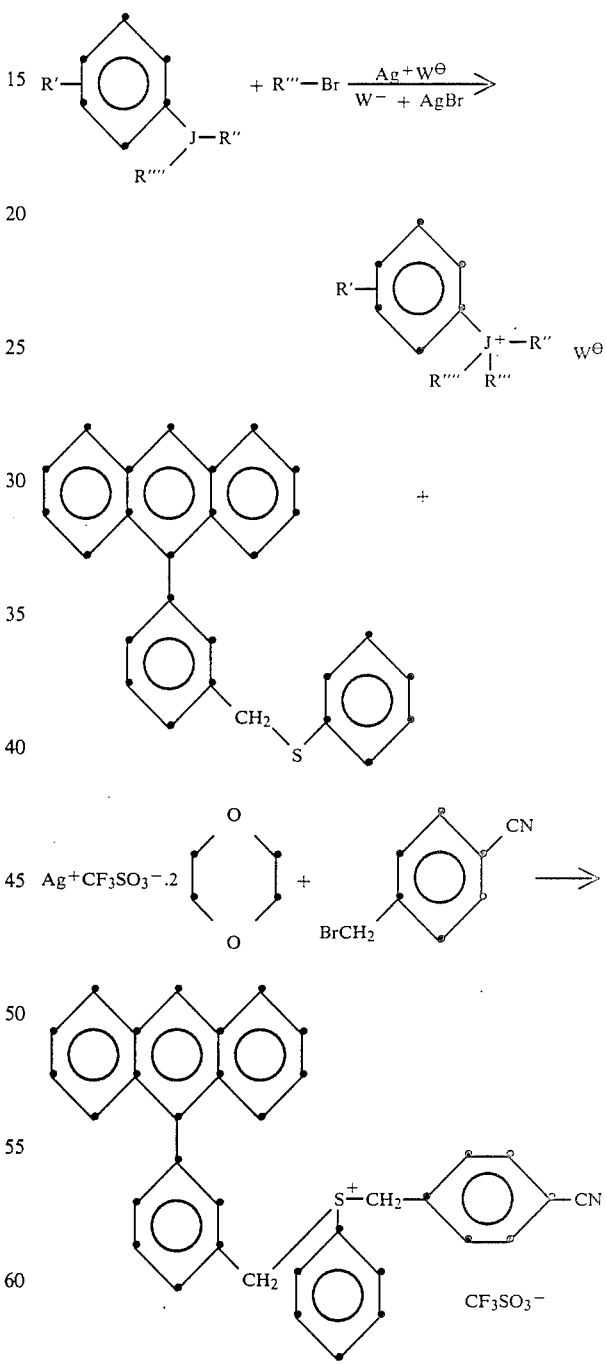

In a 100-ml round-bottom flask were placed 2.00 g of the anthrylsulfide and 1.1 g of p-cyanobenzyl bromide. To the solid mixture was added 30 ml of methylene chloride. A solution was formed. To the solution was added 2.4 g of the appropriate silver salt. The reaction was allowed to stir overnight. An H¹NMR spectrum indicated about 80% conversion with no benzyl bromide present. The precipitated silver salts were filtered off. The methylene chloride solvent was removed by evaporation. To the semisolid was added 5 ml of chloroform. The chloroform solution was dropped into 300 ml of carbon tetrachloride, the product oiled out. The carbon tetrachloride was decanted off and the product dissolved in acetonitrile. The acetonitrile solution was dropped into diethyl ether (100 ml). The product was collected by filtration as off-white solid; the yield was 2.55 g. The crude was recrystallized from CH₃CN/ether.

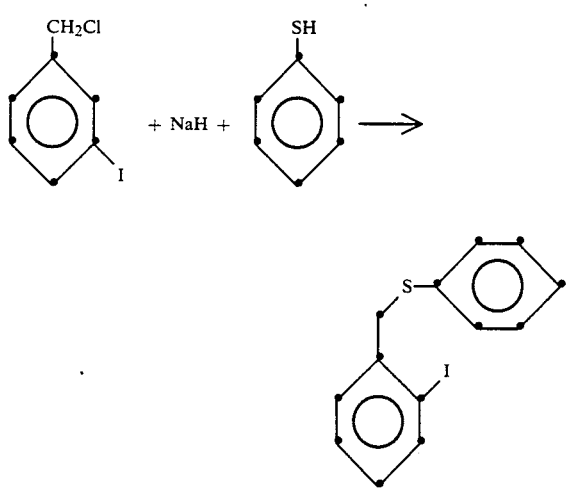

In a 250-ml 3-neck round-bottom flask were placed 26 g of sodium hydride. The hydride was washed with cyclohexane and then suspended in 100 ml of anhydrous THF (tetrahydrofuran). Then a solution of 4.4 g of the thiophenol in 50 ml of THF was added dropwise over ½ hr, and allowed to stir for an additional ½ hr. Then a solution of 3-iodobenzylchloride, 10 g in 50 ml of THF was added. After 30 min, the reaction was quenched with 10 ml of 10% HCl. Then ~200 ml of diethyl ether was added. The ether layer was extracted with dilute NaOH, and then with water. The ether layer was dried over MgSO₄ and flash-evaporated to yield 12.5 g of crude product. The crude product was distilled under vacuum. The product had a boiling point of 145°–150° C. (0.5 mmHg).

5-H,H-12-oxonaphthacene

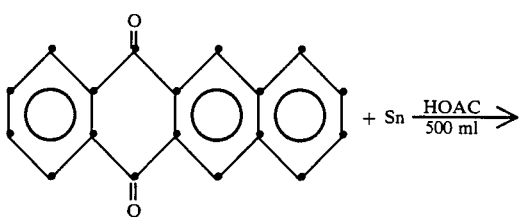

In a 1-l single-neck round-bottom flask were placed 20 g of the 5,12-naphthacenequinone, 40 g of Sn and 500 ml of acetic acid. The mixture was refluxed for 1.5 hr. Then 40 ml of concentrated HCl was added. The mixture was allowed to cool and the product was collected by suction filtration. Crude yield was 17 g. Recrystallization from toluene provided 15 g of purified product.

5-[3-thiomethylphenyl]naphthacene

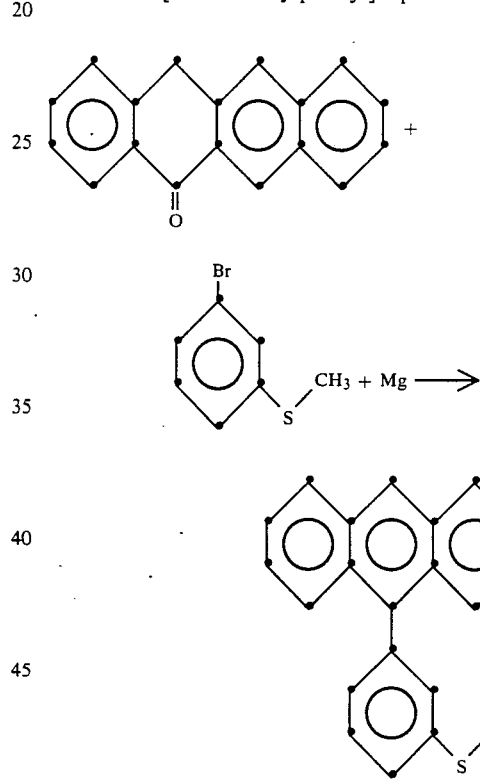

The Grignard reagent was formed by placing the aryl bromide, Mg° and 50 ml of anhydrous THF in a 100-ml 3-necked round-bottom flask and allowing the mixture to reflux for 4 hr. Then the 5-H,H-12-oxonaphthacene was added as a solid and the purple mixture was heated at reflux for 3 hr. The mixture was allowed to stir overnight at room temperature before adding 10 ml of concentrated HCl to the reaction mixture. The solution was heated at reflux for 15 min and cooled to room temperature. The reaction mixture was extracted with diethylether and the combined ether layers were extracted with 100 ml of 10% sodium carbonate, and then with water. The ether solution was dried with MgSO₄, filtered and flash-evaporated. The solid was slurried in a small amount of EtOH and filtered. The crude product yield was 1.05 g.

4-cyanobenzyl-3-[5-naphthacenyl]phenylmethyl-sulfonium trifluoromethanesulfonate In a 15-ml round-bottom flask were placed 0.1 g (0.23 mmole) of 5-[3-thiomethylphenyl] naphthacene, 0.05 g (0.25 mmole) of p-cyanobenzylbromide and 5 ml of methylene chloride. Then 0.11 g of silver trifluoromethanesulfonate di-dioxane was added and the reaction was allowed to stir for 24 hr at room temperature. The methylene chloride was evaporated and 1 ml of acetonitrile was added. The insoluble silver salts were removed by filtration. The solution was then added to 150 ml of diethyl ether. The crude product crystallized and was collected by filtration. The product yield of 4-cyanobenzyl-3-[5-naphthacenyl]phenylmethylsulfonium trifluoromethanesulfonate was 0.1 g, mp: 113°–114° C. (dec.).

3-[5-naphthacenyl]benzylmethyl ether (A)

The Grignard reagent from 3-bromobenzylmethyl ether was prepared by adding magnesium to a solution of 3-bromobenzylmethyl ether in anhydrous THF and refluxing for 2 hr. Then the 5-oxo-12(H,H)dihydronaphthacene was added as a solid. The solution was refluxed for 3 hr and cooled prior to the addition of concentrated HCl. The mixture was refluxed for an additional hour. Once the reaction mixture cooled to room temperature, it was extracted with diethyl ether. The organic layer was then washed with a 10% bicarbonate solution, and finally with $H_2O$. The ether solution was dried with $MgSO_4$, filtered and flash-evaporated to yield the crude product. The crude product was recrystallized from ethanol.

3-[5-naphthacenyl]benzylbromide (B)

A solution of (A) in chloroform was treated with a steady stream of hydrogen bromide gas for 8 hr, and then allowed to stir for 16 hr. The reaction was washed with a bicarbonate solution and with $H_2O$. The chloroform was dried with $MgSO_4$ and flash-evaporated. The crude product was recrystallized from cyclohexane.

4-cyanobenzyl-3-[5-naphthacenyl]benzyldimethyl ammonium bromide (C)

A mixture of (B) and N,N-dimethyl-4-cyanobenzylamine in acetonitrile was refluxed for 2 hr. The reaction mixture was then poured into diethyl ether, and the crude product was collected by filtration. The crude product was recrystallized from ethanol. The same reaction can be used to prepare the corresponding phosphonium and arsonium salts.

The following examples show the use of the salts of the invention to produce the imagewise release of chemical fragments in a polymer system for photoresist applications.

EXAMPLE 1

Imagewise Release of a Chemical Fragment

3-[5-naphthacenyl]phenylmethyl-p-cyanobenzylsulfonium trifluoromethanesulfonate (10% by weight) was dissolved in sufficient acetonitrile solvent along with polyvinyl-(4-t-butylphenylcarbonate) as host polymer (90% by weight) to make a homogeneous solution. A film of the polymer-photoacid composition was cast onto a silicon wafer. The film was then irradiated in an imagewise fashion with an argon ion laser emitting at 488/514 nm. In the irradiated areas, a Bronsted acid was produced which catalyzed the thermal transformation of the original polymer to polyvinylphenol after heating at 100° C. for 5–15 min. When 2-[5-naphthacenyl]-phenylmethyl-p-cyanobenzylsulfonium trifluoromethanesulfonate was used as sensitizer, longer exposure and development times were required indicating less Bronsted acid was formed per photon. The regions containing the polyvinylphenol were then selectively removed with an aqueous base solution (10–50% hydroxide solution).

EXAMPLE 2

Imagewise Release of a Silane Chemical Fragment

3-[5-naphthacenyl]phenyl-n-butyl-p-cyanobenzylsulfonium hexafluorophosphate (10% by weight) was dissolved in sufficient dichloromethane along with a polyvinylbenzyl polymer containing pendant allyl-t-butyldimethyl silyl groups (90% by weight) to make a homogeneous solution. A film of the polymer-photoacid composition was cast onto a silicon wafer. The film was then irradiated in an imagewise fashion using an argon ion laser emitting at 488/514 nm. In the irradiated area a Bronsted acid was produced which catalyzed the thermal transformation to the vinyl polymer without the pendant silane functionality. Exposure of the irradiated and heated film to an oxygen plasma selectively removed the irradiated areas by a completely dry process.

EXAMPLE 3

Imagewise Release of a Chemical Fragment

3-[5-naphthacenyl]phenylethyl-p-cyanobenzylsulfonium hexafluoroantimonate (10% by weight) was dissolved in sufficient acetonitrile solvent along with polyvinyl-(4-t-butylphenylcarbonate) as host polymer (90% by weight) to make a homogeneous solution. A film of the polymer-photoacid composition was cast onto a silicon wafer. The film was then irradiated in an imagewise fashion with an argon ion laser emitting at 488/514 nm. In the irradiated areas a Bronsted acid was produced which catalyzed the thermal transformation of the original polymer to polyvinylphenol after heating at 100° C. for 5–15 min. The regions containing the polyvinylphenol were then selectively removed with an aqueous base solution (10–50% hydroxide solution). When 4-[5-naphthacenyl]-phenylethyl-p-cyanobenzylsulfonium hexafluoroantimonate was used as the sensitizer, considerably longer exposure times were required to produce a comparable effect.

EXAMPLE 4

Imagewise Release of a Silane Chemical Fragment

3-[9-(10-methoxy)anthryl]phenylmethyl-p-cyanobenzylsulfonium trifluoromethanesulfonate (10% by weight) was dissolved in sufficient dichloromethane along with a polyvinylbenzyl polymer containing pendant allyl-t-butyldimethyl silyl groups (90% by weight) to make a homogeneous solution. A film of the polymer-photoacid composition was cast onto a silicon wafer. The film was then irradiated in an imagewise fashion using a mercury-xenon lamp. In the irradiated area a Bronsted acid was produced which catalyzed the thermal transformation to the vinyl polymer without the pendant silane functionality. Exposure of the irradiated and heated film to an oxygen plasma selectively removed the irradiated areas by a completely dry process.

Results similar to those described in the above examples can be obtained with other sulfonium and arsonium salts of the type described above. Also, by employing a protonating material such as water, phenol or an alcohol, similar results can be obtained with the phosphonium and ammonium salts described above, and with the sulfonium, selenonium and arsonium salts described above but in which the chromophore does not contain a removable, positive hydrogen ion.

The following examples illustrate polymer coatings by photoinduced cationic polymerization of epoxide monomers and prepolymers.

EXAMPLE 5

3-[9-(10-methoxy)anthryl]phenylmethyl-p-cyanophenylsulfonium trifluoromethanesulfonate (0.1 g) was dissolved in methylene chloride (10 ml) along with cyclohexene oxide (1.0 g) and the mixture coated onto a glass substrate and irradiated with visible light from a 200-watt Hg-Xe lamp positioned 4" from the substrate. The solution polymerized after exposure to visible radiation for 1 min and heating at 50° C. for 30 min. Polymerization was initiated by the Bronsted acid released when the sulfonium salt was irradiated.

EXAMPLE 6

3-[9-(10-t-butoxy)anthryl]phenylmethyl-p-cyanophenylsulfonium hexafluoroantimonate (0.2 g) was dissolved in methylene chloride (2 ml) along with Bisphenol A diglycidyl ether monomer (1.0 g). A film of the prepolymer/sulfonium sensitizer composition was formed on a glass substrate by spin coating. The thin film (about 0.5 micrometer) was irradiated for 2 min with a 200-watt Hg-Xe lamp as previously described. The polymer film became tough and cross-linked after heating at 50° C. for 30 min. Cross-linking was initiated by the Bronsted acid released when the sulfonium salt was irradiated.

EXAMPLE 7

3-[9-(10-methoxy)anthryl]phenyl-n-butyl-p-cyanobenzylsulfonium hexafluorophosphate was dissolved in methylene chloride (2 ml) along with Bisphenol A diglycidyl ether monomer (1.0 g). A film of the prepolymer/sulfonium sensitizer composition was formed on a glass substrate by spin coating. The thin film (about 0.5 micrometer) was irradiated for 2 min with a 200-watt Hg-Xe lamp as previously described. The polymer film became tough and cross-linked after heating at 50° C. for 30 min. Cross-linking was initiated by the Bronsted acid released when the sulfonium salt was irradiated.

EXAMPLE 8

3-[5-naphthacenyl]phenyl-n-butyl-p-cyanobenzylsulfonium hexafluoroantimonate was dissolved in methylene chloride (2 ml) along with Bisphenol A diglycidyl ether monomer (1.0 g). A film of the prepolymer/sulfonium sensitizer composition was formed on a glass substrate by spin coating. The thin film (about 0.5 micrometer) was irradiated for 2 min with a 200-watt Hg-Xe lamp as previously described. The polymer film became tough and cross-linked after heating at 50° C. for 30 min. Cross-linking was initiated by the Bronsted acid released when the sulfonium salt was irradiated.

EXAMPLE 9

3-[9-(10-methoxy)anthryl]phenylmethyl-p-cyanobenzylsulfonium trifluoromethanesulfonate (0.2 g) was dissolved in methylene chloride (2 ml) along with Bisphenol A diglycidyl ether monomer (1.0 g). A film of the prepolymer-sulfonium sensitizer composition was formed on a glass substrate by spin coating. The thin film (0.5 micrometer) was irradiated for 2 min with a 200-watt Hg-Xe lamp as previously described. The polymer film became tough and cross-linked after heating at 50° C. for 30 min. Use of 4-[9-(10-methoxy)-anthryl]phenylmethyl-p-cyanobenzylsulfonium trifluoromethanesulfonate as sensitizer required irradiation for 5 min to produce polymerization. Cross-linking was initiated by the Bronsted acid released when the sulfonium salt was irradiated.

The following examples illustrate imagewise dye absorption changes as a result of dye protonation.

EXAMPLE 10

3-[9-anthryl]phenylmethyl-p-cyanobenzylsulfonium hexafluoroantimonate (0.2 g) was dissolved in methylene chloride (5 ml) along with polystyrene, MW=100,000, (1.0 g) and propyl red indicator (0.001 g). A film of the above composition was formed on a 1" round glass disc (⅛" thick) by spin coating. The polymer film was then exposed to visible light from a Hg-Xe lamp positioned 4" from the substrate for 3 min. The initially yellow film turned red after the irradiation was complete as a result of the Bronsted acid released from the sulfonium salt and protonation of the propyl red indicator.

EXAMPLE 11

3-[9-(10-methoxy)anthryl]phenylmethyl-p-cyanobenzylsulfonium trifluoromethanesulfonate (0.3 g) was dissolved in methylene chloride (5 ml) along with polystyrene, MW=100,000, (1.0 g) and propyl red indicator (0.001 g). A film of the above composition was formed on a 1" round disc (⅛" thick) by spin coating. The polymer film was then exposed to visible light from a Hg-Xe lamp positioned 4" from the substrate for 3 min. The initially yellow film turned red after the irradiation was complete as a result of the Bronsted acid released from the sulfonium salt and protonation of the propyl red indicator.

The following examples illustrate imagewise conductive films for electrophotographic copying, printing plates, circuit board fabrication, and fabrication of color filter arrays.

EXAMPLE 12

3-[9-(10-methoxy)anthryl]phenyl-n-butyl-p-cyanobenzylsulfonium hexafluorophosphate (0.2 g) was dissolved in methylene chloride (5 ml) along with polystyrene, MW=100,000, (1.0 g). A film of the above composition was cast onto a conductive substrate of either aluminum or nesa (InSnO) glass by spin coating. The solvent was allowed to evaporate in a vacuum oven with heating (25°-50° C. for 30 min). The polymer film was then exposed to visible light from a Hg-Xe lamp through a mask for 1 min. The film was then charged with either a positive or negative corona while the conductive layer was held to ground. The ion-charge discharges more rapidly in the irradiated areas due to the presence of a Bronsted acid to produce a latent charged image which can be visualized by the conventional toning procedure. Transfer of the toned image to paper converts it to a permanent state. Additional copies of the charged image can be made by repeating the charging, toning, and transfer process without repeating the exposure step.

EXAMPLE 13

3-[9-(10-ethoxy)anthryl]phenyl-n-butyl-p-cyanobenzylsulfonium hexafluorophosphate (0.10 g) was dissolved in methylene chloride (5 ml) along with poly(-vinyl)benzoate, MW=100,000, (1.0 g). A film of the above composition was cast onto a conductive substrate of either aluminum or nesa (InSnO) glass by spin coating. The solvent was allowed to evaporate in a vacuum oven with heating (25°–50° C. for 30 min). The polymer film was then exposed to visible light from a Hg-Xe lamp through a mask for 1 min. The film was then charged with either a positive or negative corona while the conductive layer was held to ground. The ion-charge discharges more rapidly in the irradiated areas due to the presence of a Bronsted acid to produce a latent image which can be visualized by the conventional toning procedure. Transfer of the toned image to paper converts it to a permanent state. Additional copies of the charged image can be made by repeating the charging, toning and transfer process without repeating the exposure step.

The following examples illustrate the use of Bronsted photoacids for the production of printing-plate masters.

EXAMPLE 14

Printing Plate Masters

3-[5-naphthacenyl]phenyl-n-butyl-p-cyanobenzylsulfonium trifluoromethanesulfonate (10% by weight) was dissolved in sufficient acetonitrile solvent along with polyvinyl-(4-t-butylphenylcarbonate) as host polymer (90% by weight) to make a homogeneous solution. A film (0.5 micron) of the polymer-photoacid composite was cast onto a flexible rectangular aluminum substrate 10"×12" in dimensions. After drying at 50° C. for 10 min, the film was exposed in an imagewise fashion with an argon-ion laser. Development to produce a relief image in the exposed areas was achieved by heating the film to 100° C. for 5 min. The aluminum substrate was then wrapped around a drum with the relief image exposed. The raised pattern could be selectively inked and the inked image transferred to a substrate such as paper. This process could be repeated many times.

EXAMPLE 15

Printing Plate Masters

3-[5-naphthacenyl]phenylmethyl-p-cyanobenzylsulfonium hexafluorophosphate was dissolved in sufficient acetonitrile solvent along with polyvinyl-(4-t-butylphenylcarbonate) as host polymer (90% by weight) to make a homogeneous solution. A film (0.5 micron) of the polymer-photoacid composite was cast onto a flexible rectangular aluminum substrate 10"×12" in dimensions. After drying at 50° C. for 10 min, the film was exposed in an imagewise fashion with an argon-ion laser. Development to produce a relief image in the exposed areas was achieved by heating the film to 100° C. for 5 min. The aluminum substrate was then wrapped around a drum with the relief image exposed. The raised pattern could be selectively inked and the inked image transferred to a substrate such as paper. This process could be repeated many times.

EXAMPLE 16

Printed Circuit Board Fabrication

3-[5-naphthacenyl]phenyl-n-butyl-p-cyanobenzylsulfonium hexafluoroantimonate (0.2 g) and poly(4-t-butylphenylcarbonate) (1.9 g) were dissolved in 5 ml of dichloromethane. A 1-mil film of the above composition was cast onto a copper substrate and allowed to dry for 15 min at 60° C. The film was exposed for 2 min in an imagewise fashion through a test target with a 5-watt argon-ion laser. The film was heat-treated at 100° C. for 1 min before development to remove the exposed regions with a 20% $Na_2CO_3$ solution. Use of a 2-[5-naphthacenyl]phenyl-n-n-butyl-p-cyanobenzylsulfonium hexafluoroantimonate as sensitizer required 3-min exposure to produce an effect comparable to the 3-isomer. The exposed copper was etched with a nitric acid solution in the presence of molecular oxygen to produce a copper pattern for a printed circuit board.

This invention has been described in detail with particular reference to preferred embodiments thereof, but it will be understood that variations and modifications can be affected within the spirit and scope of the invention.

What is claimed is:

1. A composition of matter comprising a material curable by a Bronsted acid, and a salt having the following formula:

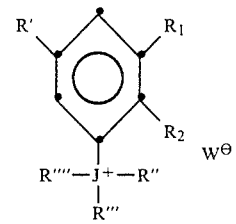

wherein:
R' represents an electron-donating chromophore group which absorbs visible radiation, and which exhibits a higher energy occupied molecular orbital than at least one of R", R''' and R'''';
R" represents the same substituent as R' or R''', an optionally substituted aryl group or an optionally substituted alkyl group having from 1 to 18 carbon atoms;
R''' represents an electron-withdrawing alkyl, aryl or heterocyclic group;
$R_1$ and $R_2$ each, independently, represents hydrogen or an electron-donating group;
J represents an S, Se, As, N or P atom; and
when J represent As, N or P, R'''' represents the same substituent as R', R" or R''' and, when J represents a S or Se atom, R'''' represents O or an electron pair; and,
$W^\ominus$ represents an anion capable of forming a Bronsted acid having a pKa of less than 7,
said compound being capable, upon exposure to visible radiation of a wavelength absorbed by said chromophore, of forming a Bronsted acid.

2. A composition of matter as defined in claim 1 wherein, in said formula, J represents an S atom.

3. A composition of matter as defined in claim 1 wherein, in said structural formula,
R' represents one of the following chromophores:

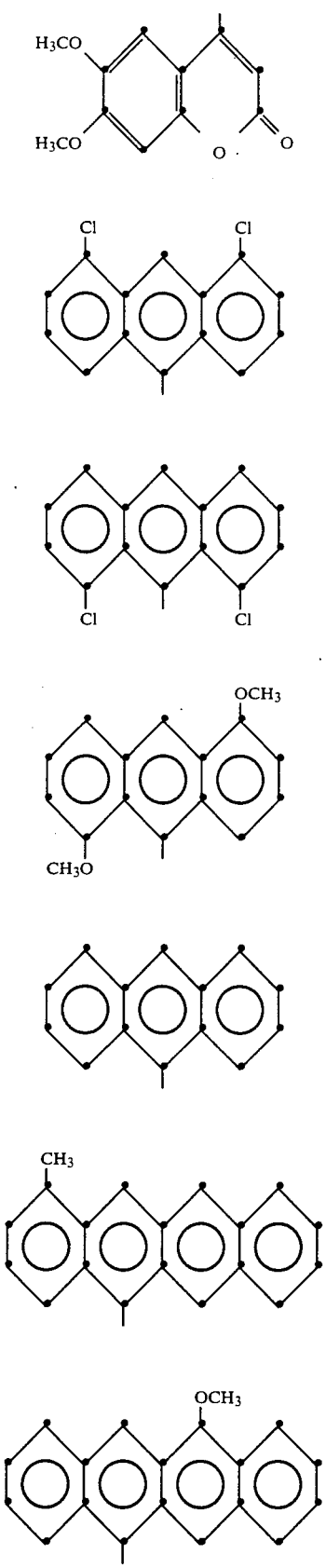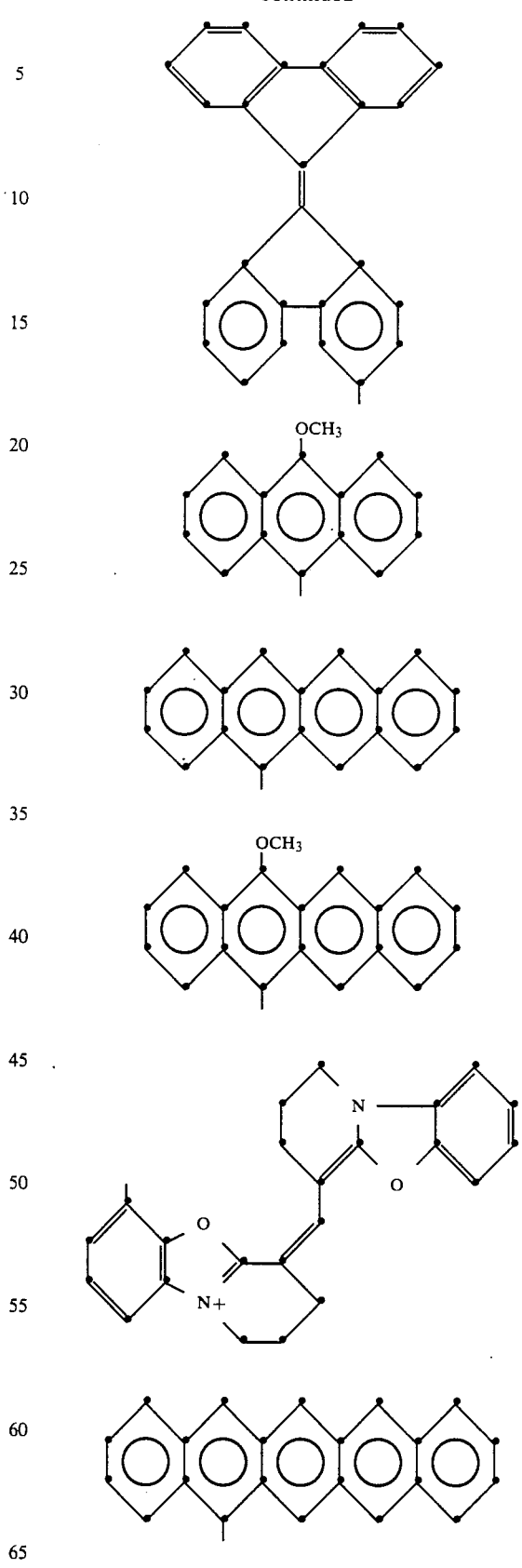
J, R″, R‴ and R″″, taken together, represent one of the following groups:

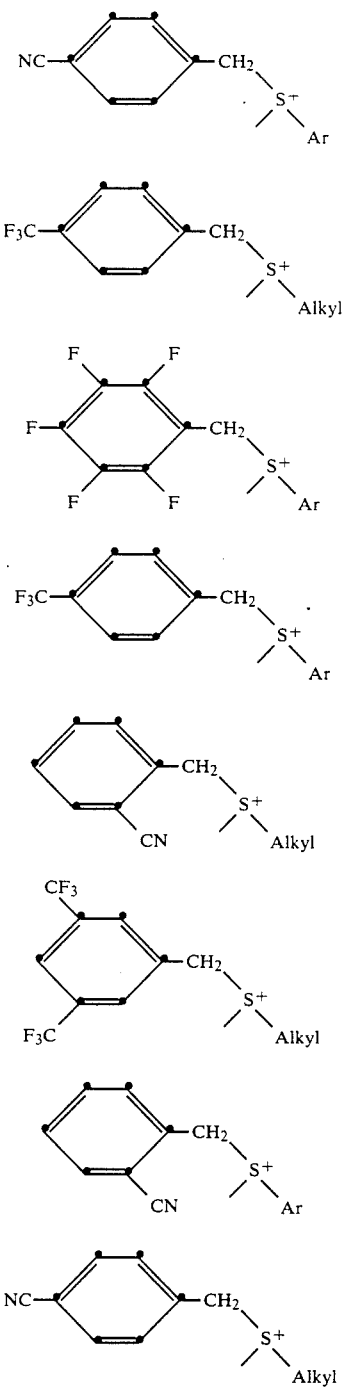

wherein

Ar represents an optionally substituent aryl group; and

W represents BF₄, ClO₄, AsF₆, PF₆, CF₃SO₃, CH₃SO₃, SnCl₄, FeCl₄, BiCl₄ or SbF₆, or p-toluenesulfonate.

4. A material useful for forming printed circuit boards comprising a conductive substrate leaving coated thereon a composition as defined in claim 1.

5. A material useful for forming printed circuit boards as defined in claim 4 which comprises a copper substrate having thereon a layer containing about 90% by weight poly(4-t-butylphenylcarbonate) and about 10% by weight 4-cyanobenzyl-3-[5-naphthacenyl]phenylmethylsulfonium trifluoromethanesulfonate.

6. A composition of matter comprising about 10% by weight of 4-cyanobenzyl-3-[5-naphthacenyl]-phenylmethylsulfonium hexafluorophosphate and about 90% by weight polyvinyl(4-t-butylphenyl carbonate).

7. A method of forming images which comprises:

A) exposing to visible radiation (1) a material curable by a Bronsted acid and (2) a compound having the formula:

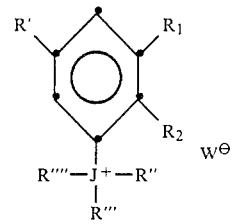

wherein:

R' represents an electron-donating chromophore group which absorbs said visible radiation, and which exhibits a higher energy occupied molecular orbital than at least one of R'', R''' and R'''';

R'' represents the same substituent as R' or R'''', an optionally substituted aryl group or an optionally substituted alkyl group having from 1 to 18 carbon atoms;

R''' represents an electron-withdrawing alkyl, aryl or heterocyclic group;

$R_1$ and $R_2$ each, independently, represents hydrogen or an electron-donating group;

J represents an S, Se, As, N or P atom; and when J represents As, N or P, R'''' represents the same substituent as R', R'' or R''' and, when J represents an S or Se atom, R'''' represents O or an electron pair; and, $W^{\ominus}$ represents an anion capable of forming a Bronsted acid having a pKa of less than 7, said compound being capable, upon exposure to visible said radiation, of forming a Bronsted acid;

B) curing said material in the area exposed to said radiation; and

C) selectively removing the uncured material in the areas not exposed to radiation.

8. A method of forming images as defined in claim 7 wherein, in said structural formula, J represents an S atom.

9. A method of forming images which comprises exposing to visible laser radiation having a wavelength of about 488–515 nm a composition comprising about 90% by weight poly(4-t-butylphenyl-carbonate) and about 10% by weight 4-cyanobenzyl-3-[5-naphthacenyl]phenyl-n-butylsulfonium hexafluorophosphate.

10. A printing plate comprising a substrate having coated thereon a layer comprising:

a material (1) curable by a Bronsted acid, (2) capable of being inked and (3) capable of transferring ink to a substrate; and a compound having the formula:

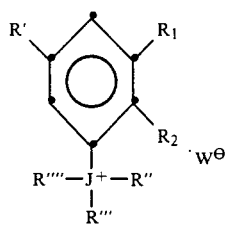

wherein:

R' represents an electron-donating chromophore group which absorbs visible radiation, has a removable positive hydrogen ion, and exhibits a higher energy occupied molecular orbital than at least one of R'', R''' and R'''';

R'' represents the same substituent as R' or R''', an optionally substituted aryl group or an optionally substituted alkyl group;

R''' represents an electron withdrawing alkyl, aryl or heterocyclic group;

$R_1$ and $R_2$ each, independently, represents hydrogen or an electron-donating group;

J represents a sulfur or arsenic atom;

when J represents As, R'''' represents the same substituent as R', R'' or R''' and, when J represents a sulfur atom, R'''' represent O or an electron pair; and, $W^{\ominus}$ represents an anion capable of forming a Bronsted acid having a pKa of less than 7;

said compound being capable, upon exposure to visible radiation of a wavelength absorbed by said chromophore, of forming, by intramolecular rearrangement, a Bronsted acid comprising W and said removable positive hydrogen of R'.

11. A printing plate as defined in claim 10 which comprises an aluminum substrate having coated thereon a film comprising about 10% by weight 4-cyanobenzyl-3-[5-naphthacenyl]benzylphenyl trifluoromethanesulfonate and about 90% by weight polyvinyl-(4-t-butylphenylcarbonate).

* * * * *